United States Patent
Endo et al.

(10) Patent No.: US 7,300,889 B2
(45) Date of Patent: Nov. 27, 2007

(54) METHOD FOR FORMING A COATING FILM ON A PLATE-LIKE WORKPIECE

(75) Inventors: Hiroki Endo, Kanagawa (JP); Taiichiro Aoki, Kanagawa (JP); Akihiko Nakamura, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 423 days.

(21) Appl. No.: 10/914,523

(22) Filed: Aug. 9, 2004

(65) Prior Publication Data
US 2005/0009363 A1    Jan. 13, 2005

Related U.S. Application Data

(63) Continuation of application No. 09/768,195, filed on Jan. 23, 2001, now abandoned.

(30) Foreign Application Priority Data
Jan. 27, 2000    (JP) ............................. 2000-018261

(51) Int. Cl.
*H01L 00/31* (2006.01)
*H01L 00/469* (2006.01)
(52) U.S. Cl. .................. 438/780; 438/781; 438/782
(58) Field of Classification Search ............ 438/780, 438/781, 782
See application file for complete search history.

(56) References Cited

U.S. PATENT DOCUMENTS 5,431,700 A * 7/1995 Sloan .................. 29/25.01
5,802,856 A * 9/1998 Schaper et al. ............ 62/3.7
6,143,360 A * 11/2000 Zhong ..................... 427/244

(Continued)

FOREIGN PATENT DOCUMENTS

JP    61-084837    4/1986

(Continued)

OTHER PUBLICATIONS

Hari Singh Nalwa, Handbook of IOW aand High Dielectric COnstant Materials and Thier Applications, Academic Press: San Diego, 1999 pp. 52-53.*

(Continued)

*Primary Examiner*—Howard Weiss
*Assistant Examiner*—Steven H Rao
(74) *Attorney, Agent, or Firm*—Carrier, Blackman & Associates, P.C.; Joseph P. Carrier; William D. Blackman

(57) ABSTRACT

A method for forming a coating film, comprises the steps of: applying a raw material of a low dielectric constant onto a surface of a plate-like material; reducing oxygen concentration in the atmosphere surrounding the plate-like material to be less than or equal to 1% before a surface temperature of said plate-like material to be treated rises to 200° C.; thereafter heating said plate-like material to a temperature greater than or equal to 400° C.; and then maintaining the oxygen content in the atmosphere to be less than or equal to 1% until the surface temperature of said plate-like material to be treated lowers to 200° C. The raw material is an organic SOG obtained by hydrolyzing and condensing at least one alkoxysilane compound into an organic solvent under an acid catalyst.

9 Claims, 2 Drawing Sheets

U.S. PATENT DOCUMENTS

| | | | |
|---|---|---|---|
| 6,225,240 B1 * | 5/2001 | You et al. | 438/782 |
| 6,261,365 B1 * | 7/2001 | Matsuyama et al. | 118/50 |
| 2001/0029111 A1 * | 10/2001 | You et al. | 438/782 |
| 2002/0006876 A1 * | 1/2002 | Hongo et al. | 505/191 |

FOREIGN PATENT DOCUMENTS

| | | |
|---|---|---|
| JP | 4216827 | 8/1992 |
| JP | 07-273051 | 10/1995 |
| JP | 9137121 | 5/1997 |
| JP | 09-199503 | 7/1997 |
| JP | 09-213693 | 8/1997 |
| JP | 10-098037 | 4/1998 |
| JP | 11-087510 | 3/1999 |
| JP | 2001-148379 | 5/2001 |

OTHER PUBLICATIONS

Wolf, Silicon Processing for the VLSI Era, vol. 2: Process Integration, LAttice Press: SUnset Beach, CA. 2000, pp. 797-801.*

* cited by examiner

PRIOR ART

METHOD FOR FORMING A COATING FILM ON A PLATE-LIKE WORKPIECE

BACKGROUND OF THE INVENTION

1. Field of the Invention

The present invention relates to a method for forming a coating film upon a surface of a semiconductor wafer, a glass substrate or the like.

2. Description of Prior Art

Demands for high integration of semiconductor devices are constantly increasing and a new generation of 0.15 μm gate lengths is now here. For such cases, it is known that improvement can be obtained in the properties of semiconductor devices by using Cu as wiring material, in place of conventional Al. That is, since Cu, has superior tolerance or resistance to EM (electro-migration), compared to Al, a low electrical resistance enables to reduce a signal delay or a decrease in level due to a wiring resistance. Therefore, it can be used under high current density. Specifically, by using this, the permissible current density can be released or enlarged up to three times, and the wiring width can also be made fine or minute.

However, compared to Al, it is difficult to control the etching rate of Cu. Therefore, attention is being paid to a copper damascene method as a means for realizing multi-layer Cu, but without the necessity of Cu etching.

Explanation will be given of the copper damascene method by referring to FIGS. 1(a) through 1(h).

First, as shown in FIG. 1(a), an interlayer isolation film of $SiO_2$, SOG, or the like is formed on a substrate by a CVD method, and on this film is provided a patterned resist mask. As shown in FIG. 1(b), wiring gutters are formed by selective etching and removal of the resist mask. Next, as shown in FIG. 1(c), a barrier metal is accumulated thereon, and as shown in FIG. 1(d), Cu is buried or filled into the wiring gutters by means of an electrolytic plating or such so as to form a lower layer wiring. Then, after polishing the barrier metal and Cu by means of CMP (chemical polishing), another interlayer insulation film is formed thereon as shown in FIG. 1(e). The interlayer insulation film is etched selectively through the resist mask, on which a pattern is formed, in the same manner, thereby forming (dual damascening) via-holes (contact holes) and trench holes (gutters for the upper layer wiring) in the interlayer insulation film as shown in FIG. 1(f). As shown in FIG. 1(g), a barrier metal is accumulated on the walls of the via-holes and the gutters for the upper layer wiring, and as shown in FIG. 1(h), Cu is buried or filled into the via-holes and the gutters for the upper layer wiring, such as by the electrolytic plating method, thereby forming the upper layer wiring.

As mentioned above, when forming a multi-layer wiring by means of the copper damascene method, it is essential to increase an aspect ratio (height/width) of the via-holes in order to obtain a minute wiring. Also, a low dielectric constant of the interlayer insulation film is required.

Studies were then conducted on the use of organic or inorganic SOG with low dielectric constants ($\epsilon=3.5$ or less). However, even if the multi-layer wiring is formed by using this kind of SOG through the copper damascene method, the dielectric constant of the SOG comes to be higher than it is by nature after forming the multi-layer wiring.

SUMMARY OF THE INVENTION

With regards to the cause of the above, the inventors of the present invention have acknowledged that Si—$CH_3$ bonding ($CH_3$ being one example) breaks and combines to form Si—OH in the case of organic SOG, and that Si—H bonding breaks and combines to form Si—OH in the case of inorganic SOG. The dielectric constant is increased due to the change in the chemical structure of the interlayer insulation film.

Further, with repetitive experiments made by the present inventors, it is also acknowledged that film reduction hardly occurs when oxygen concentration is less than or equal to 1% when it is baked, and that the Si—$CH_3$ bonding and the Si—H bonding break and form Si—OH when the temperature rises to 200° C. or more which causes a increase in the reactivity.

The present invention is based on what has been acknowledged above, and according to the present invention, there is provided a method for forming a coating film, comprising the following steps: applying a raw material of a low dielectric constant onto a surface of a plate-like material to be treated such as a semiconductor wafer or a glass substrate; reducing the oxygen concentration in the atmosphere to less than or equal to 1% before the surface temperature of the plate-like material to be treated rises to 200° C.; thereafter heating the plate-like material to be treated to be greater than or equal to 400° C. while maintaining the oxygen concentration at less than or equal to 1%; and then maintaining the oxygen concentration in the atmosphere at less than or equal to 1% until the surface temperature of the plate-like material to be treated lowers to 200° C.

According to the present invention, the oxygen concentration in the atmosphere may be lowered to less than or equal to 1% by purging $N_2$ gas.

Also, the method for forming the coating film according to the present invention is preferably conducted in one baking furnace, in the upper portion of which is positioned a hot plate, while in the lower portion of which is positioned a cool plate, wherein the plate-like material to be treated can come close to either one of the hot plate and the cool plate selectively by means of an elevator means.

By conducting the method within the one baking furnace, it is possible to achieve a small-sizing of a processing unit. However, it may be possible to use an apparatus comprising a heating chamber and a cooling chamber which is connected by a load lock.

Further, the present invention is preferably applied to a forming of an interlayer insulation film by a damascene method, but is not limited to this.

DESCRIPTION OF PREFERRED EMBODIMENTS

Figure 1:
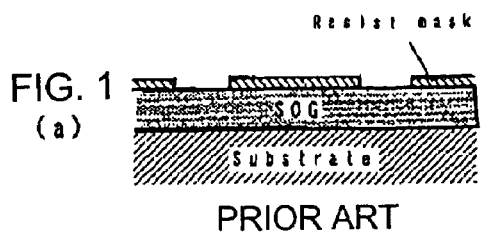
FIGS. 1(a) to 1(h) are views for explanation of the forming steps of the multi-layer wiring structure through the copper damascene method.
Figure 1:
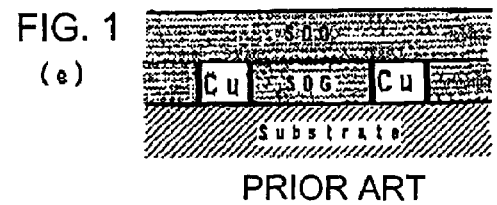
Figure 1:
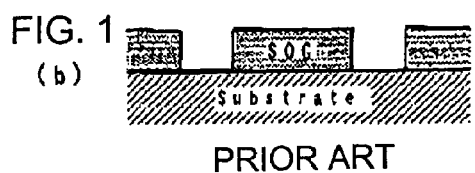
Figure 1:
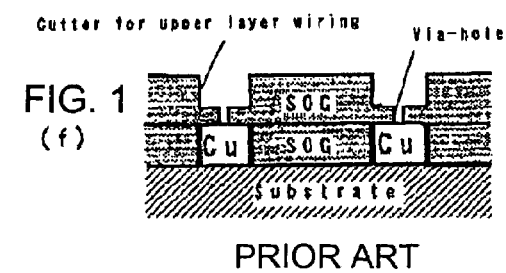
Figure 1:
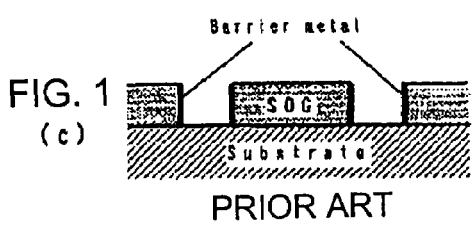
Figure 1:
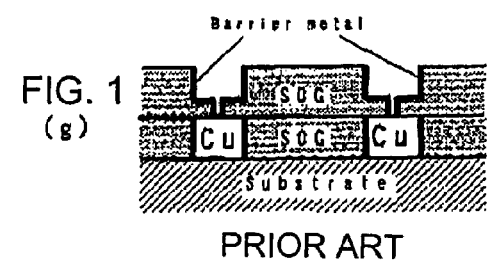
Figure 1:
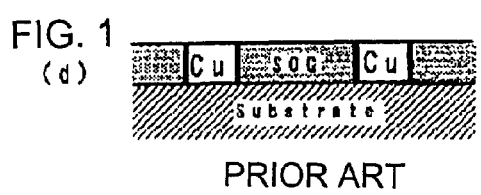
Figure 1:
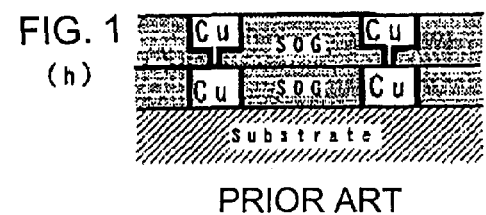
Figure 2:
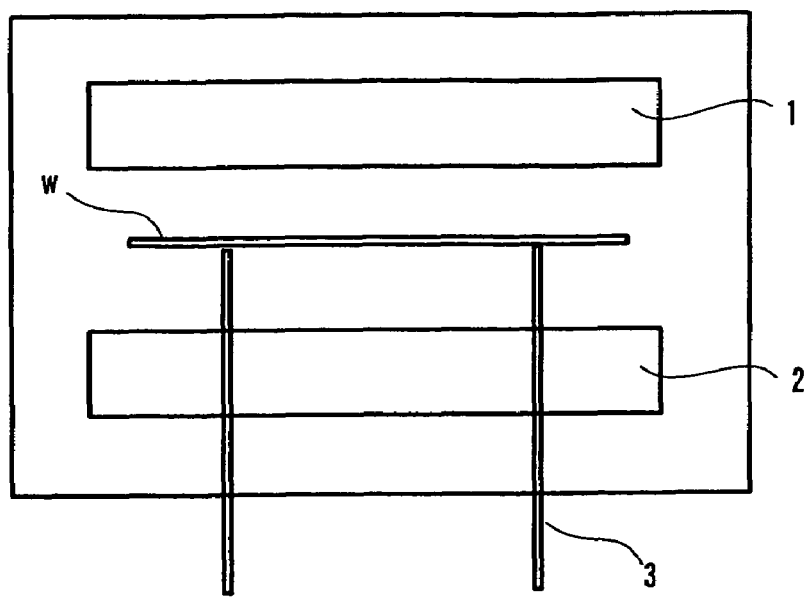
FIG. 2 is an outline view of an apparatus for use in the present invention.

Hereinafter, embodiments according to the present invention will be fully explained by referring to the attached drawings. FIG. 2 shows an outline structure of the apparatus for implementing the present invention, wherein are provided a hot plate (a bake plate) 1 in an upper portion, a cool plate 2 in a lower portion, and an elevator means 3 for elevating and lowering a plate-like material to be treated W through the cool plate 2. Examples of the plate-like material to be treated W include a semiconductor wafer, a glass substrate, a metal plate, and a ceramic substrate.

Although not shown in the figure, in this apparatus are provided a window portion, which can be freely opened or closed for taking the plate-like material to be treated W in and out, and a gas supply conduit for supplying an atmospheric gas such as $N_2$ gas, and a gas discharge conduit for discharging the atmospheric gas within the apparatus.

For forming a coating film on the surface of a plate-like material to be treated W by using the apparatus mentioned above, the plate-like material to be treated W, on the surface of which an unbaked applying film comprised of a raw material of a low dielectric constant is formed, is entered into the apparatus. Coating liquid is applied onto the surface of the plate-like material to be treated W by a method for forming the applying film comprised of a low dielectric constant, such as a spinning method, a roll coating method, a dipping and hoisting up method, a spraying method, a screen printing method, and a brush painting method. The solvent is evaporated, thereby forming the applying film.

For the interlayer insulation film, the dielectric constant is preferably less than or equal to 3.5. The coating liquid for forming this kind of film is, for example, organic SOG or inorganic SOG. For the organic SOG, organic SOG having carbon content of 5 to 25 atomic % is preferable, and the carbon content being more preferably 8 to 20 atomic %.

Carbon content indicates a ratio of an organic group within organic SOG. In more detail, it is theoretically calculated from an amount of reaction of alkoxysilane compound from which is prepared coating liquid for forming organic SOG, and it is a ratio of the carbon atom weight with respect to the total atomic weight of all chemical elements thereof.

If the carbon content is smaller than the range mentioned above, the organic component is too little to form a thick film. Also, cracks easily occur, and the inherent advantage of organic SOG, i.e., a low dielectric constant, is eroded. On the contrary, if it is too much, shortage in the stickiness with the barrier metal layer occurs, therefore being not preferable.

For obtaining the applying film having the carbon content mentioned above, it is preferable to use coating liquid, which is obtained by hydrolyzing and condensing an alkoxysilane compound containing at least one kind that is selected from the alkoxysilane compounds expressed by the following equation (I) into an organic solvent under an acid catalyst.

General equation $RnSi(OR^1)_{4-n}$ (I)

(Where R in the general equation (I) means an alkyl group or an aryl group having a carbon number of 1-4, $R^1$ an alkyl group having a carbon number of 1-4, and n an integer of 1-2.)

Examples of the chemical compounds which can be expressed by the above-mentioned general equation (I) include the following:

(A) in the case of n=1: monoalkyl trialkoxysilane such as monomethyl trimethoxysilane, monomethyl triethoxysilane, monomethyl tripropoxysilane, monoethyl trimethoxysilane, monoethyl triethoxysilane, monoethyl tripropoxysilane, monopropyl tritrimethoxysilane, and monopropyl triethoxysilane; and monophenyl trialkoxysilane such as monophenyl trimethoxysilane and monophenyl triethoxysilane.

(B) in the case of n=2: dialkyl dialkoxysilane such as dimethyl dimethoxysilane, dimethyl diethoxysilane, dimethyl dipropoxysilane, diethyl dimethoxysilane, diethyl diethoxysilane, diethyl dipropoxysilane, dipropyl didimethoxysilane, dipropyl diethoxysilane, and dipropyl dipropoxysilane; and diphenyl dialkoxysilane such as diphenyl dimethoxysilane and diphenyl diethoxysilane.

It is necessary to use at least one kind from (A) and (B).

As may be desired, as other components which can perform co-condensation with (A) and (B), it is also effective to use the following, (C) in the case of n=0 in the chemical compounds expressed by the general equation (I) mentioned above: i.e., tetraalkoxysilane such as tetramethoxysilane, tetraethoxysilane, tetrapropoxysilane, and tetrabutoxysilane.

Among these, preferable chemical compounds in practice include: tetramethoxysilane, tetraethoxysilane, monomethyl trimethoxysilane, monomethyl triethoxysilane, dimethyl dimethoxysilane, and dimethyl diethoxysilane.

These alkoxysilane compounds can be used by one kind, or by two or more.

Specifically, it is preferable to use a chemical compound which is obtained by combining two kinds of (A) and (C) or three kinds of (A), (B) and (C), or use one kind of chemical compound from (A).

With regards to the reaction mol ratio in such instances, in the case of combining two kinds of (A) and (C), it is preferable to use a coating liquid containing a hydrolytic co-condensation product therein which is obtained by reacting 2-6 mols or more preferably 2-4 mols of monoalkyl trialkoxysilane of (A) with respect to 1 mol of tetraalkoxysilane of (C) within an organic solvent under an acid catalyst, because of the superiority in adhesiveness or stickiness between the lower layer.

In the case of combining three kinds of (A), (B), and (C), it is preferable to use a coating liquid containing a hydrolytic co-condensation product therein which is obtained by reacting 0.5-4.0 mols or more preferably 1.0-3.0 mols of tetraalkoxysilane of (C) and 0.5-4.0 mols or more preferably, 0.5-3.0 mols of monoalkyl trialkoxysilane of (A) with respect to 1 mol of dialkyl dialkoxysilane of (B) within an organic solvent under an acid catalyst, because of the superiority in adhesiveness or stickiness between the lower layer.

Further, in the case of using monoalkyl trialkoxysilane of (A) alone, hydrolytic condensation product of a ladder type can be easily obtained. Since this ladder type can form a film of the lowest dielectric constant, among organic and inorganic SOG, it is preferable.

The hydrolytic product may be obtained by hydrolyzing completely or partially. The degree of hydrolysis can be adjusted by the amount of water added, and the amount of water added may be adjusted depending upon the characteristics of the organic SOG to be desired. In general, it is preferable to react water in 1.0-10.0 times mol or more preferably 1.5-8.0 times mol with respect to a total amount of 1 mol of the alkoxysilane compound which can be expressed by the general equation mentioned above. If it is too small compared to this range, the degree of hydrolysis will be low and thereby it will be difficult to form the coating film. If it is too much, gelation will readily occur and thereby it will be unstable when stored. Both cases are not preferable.

Either an organic or inorganic acid which is common in the conventional art may be used as the acid catalyst. An organic carboxylic acid such as an acetic acid, a propionic acid, or a butyric acid may be used as the organic acid. A hydrochloric acid, a nitric acid, a sulfuric acid, or a phosphoric acid may be used as the inorganic acid.

In this instance, the acid catalyst is added into the coating liquid so that the concentration of acid in the coating liquid comes into a range from 1 ppm to 1,000 ppm, more preferably a range from 5 ppm to 500 ppm, or a mixture of an acid and water is added as an acid aqueous solution, thereby causing the hydrolysis.

The hydrolysis reaction is commonly completed in around from 5 hours to 100 hours. The reaction can also be completed in a short period of time by dripping an aqueous solution of an acid catalytic into an organic solvent containing an alkoxysilane compound under a heating temperature not exceeding a range from room temperature to 80° C. The alkoxysilane compound, being obtained through the hydrolysis in this manner, causes a condensation reaction, and as a result, it has an ability of forming a coating film.

Conventional organic solvents can be used for the organic solvent. These organic solvents include: monohydric alcohol such as methyl alcohol, ethyl alcohol, propyl alcohol, and butyl alcohol; polyhydric alcohol such as ethylene glycol, diethylene glycol, and propylene glycol; polyhydric alcohol derivatives such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, ethylene glycol monomethyl ether acetate, ethylene glycol monoethyl ether acetate, propylene glycol monomethyl ether acetate, and propylene glycol monoethyl ether acetate; and fatty acids such as an acetic acid or a propionic acid. These organic solvents can be used alone or by combining two kinds thereof or more. They are used in 10-30 times mol with respect to 1 mol of alkoxysilane.

On the other hand, the inorganic SOG is made of a solution which includes a solvent of alkylene glycol dialkyl ether containing the condensation product obtained through acid hydrolysis of trialkoxysilane therein, and it is preferable to use one which shows the increase in weight in a case where a thermogravimetric measurement is made on the formed coating film after the removal of the solvent, because of the superiority in a low dielectric constant and a anti-crack property.

The above inorganic SOG can be obtained by dissolving the trialkoxysilane which is disclosed in the Japanese Patent Application Laid-Open No. Hei 9-137121 (1997) into alkylene glycol dialkyl ether at a concentration of 1-5 weight % by converting into $SiO_2$, adding water of 2.5-3.0 mols per 1 mol of the trialkoxysilane into this solution; and adjusting the alcohol content that is produced through the reaction in the reacting mixture to be less than or equal to 15 weight % after performing the hydrolytic condensation under an acid catalyst.

The reason why the concentration of trialkoxysilane is made to be 1-5 weight % by converting into $SiO_2$ is that the interlayer insulation film having a ladder structure can be obtained therewith. Irrespective of being organic or inorganic, due to a ladder structure, a refined film having a low dielectric constant can be preferably formed as mentioned above.

The trialkoxysilane mentioned above can include: trimethoxysilane, triethoxysilane, tripropoxysilane, tributoxysilane, diethoxy monomethoxysilane, monomethoxy dipropoxysilane, dibutoxy monomethoxysilane, ethoxymethoxy propoxysilane, monoethoxy dimethoxysilane, monoethoxy dipropoxysilane, butoxyethoxy propoxysilane, dimethoxy monopropoxysilane, diethoxy monopropoxysilane, and monobutoxy dimethoxysilane. Among these, preferable chemical compounds in practice are: trimethoxysilane, triethoxysilane, tripropoxysilane, and tributoxysilane; and, in particular, trimethoxysilane and triethoxysilane are preferable.

Next, as the solvent, in order to increase the stability in storage, it is necessary to use alkylene glycol dialkyl ether. By using this, it is possible to control a decomposition reaction with regards to a H—Si group of trialkoxysilane, or a reaction of substituting a hydroxy group for an alkoxy group in silanol produced as an intermediate product, which occurs in the conventional art using lower alcohol as a solvent, thereby enabling to prevent the gelation.

The alkylene glycol dialkyl ether can include: a dialkyl ether type of alkylene glycol such as ethylene glycol dimethylether, ethylene glycol diethylether, ethylene glycol dipropylether, ethylene glycol dibutylether, diethylene glycol dimethylether, diethylene glycol diethylether, diethylene glycol dipropylether, diethylene glycol dibutylether, propylene glycol dimethylether, propylene glycol diethylether, propylene glycol dipropylether, and propylene glycol dibutylether. Among these, a preferable chemical compound is a dialkyl ether type of ethylene glycol or propylene glycol, and in particular, dimethylether. These organic solvents may be used alone or by combining two or more kinds thereof. They are used in 10-30 times mol with respect to 1 mol of alkoxysilane.

The water for performing hydrolysis of trialkoxysilane must be within a range of 2.5-3.0 mols with respect to 1 mol of trialkoxysilane, more preferably within a range of 2.8-3.0 mols, so as to increase the degree of hydrolysis. If it is too small compared to this range, although the stability in storage is increased, the degree of hydrolysis is deteriorated, the content of organic groups in the hydrolysis product is increased, and thereby gas is generated at the time of forming a coating film. If it is too much compared to this range, the stability in storage is deteriorated.

In a case of using at least one kind selected among alkylene glycol dialkyl ether without using alcohol as a solvent, since alcohol corresponding to the alkoxy group is inevitably generated in the course of the hydrolysis of alkoxysilane, it is necessary to remove the generated alcohol from the reaction system. Specifically, it is necessary to remove the alcohol to be less than or equal to 15 weight % in this coating liquid, or more preferably, to be less than or equal to 8 weight %. If the alcohol exceeds 15 weight %, the H—Si group and the generated alcohol react each other, an RO—Si group is generated, and thereby the crack limit is deteriorated. In addition, gas is generated at the time of forming a coating film, and thereby the trouble mentioned above occurs.

As a method for removing the alcohol, distillation under reduced pressure for 2-6 hours in a temperature of 20-50° C. in a degree of vacuum of 30-300 mmHg or more preferably 50-200 mmHg is preferable. The coating liquid obtained in this manner has characteristics of showing the increase in weight in a case where a thermogravimetric measurement is made on the formed coating film after the removal of the solvent, and not having its peak at 3,000 $cm^{-1}$ in the infrared absorption spectrum. The conventional coating liquid, which is described in Japanese Patent Application Laid-Open No. Hei 4-216827 (1992), shows the decrease in weight in a case where a thermogravimetric measurement is made, and it has its peak in the vicinity of 3,000 $cm^{-1}$ in the infrared absorption spectrum, which indicates that an alkoxy group still exists therein.

With regards to the interlayer insulation film, the detailed explanation was made on the organic and inorganic SOG, however the interlayer insulation film, which can be used in the present invention, should not be limited to these.

When the plate-like material to be treated W, on the surface of which the applying film as mentioned above is formed, is entered into the apparatus, the elevator means 3 is lowered, so that the plate-like material to be treated W comes close to the cool plate 2, and further $N_2$ gas is introduced into the apparatus. Then, the oxygen concentration in the atmosphere is reduced to less than or equal to 1% before the surface temperature of the plate-like material to be treated W rises to 200° C.

Thereafter, while maintaining the oxygen concentration to be less than or equal to 1%, the elevator means 3 is elevated, so that the plate-like material to be treated W comes close to the hot plate 1, and the surface of the plate-like material to be treated W is heated to be greater than or equal to 400° C. After such a condition is continued for a predetermined period of time, the temperature is lowered. In this instance, the oxygen concentration in the atmosphere is maintained to be less than or equal to 1% until the surface temperature of the plate-like material to be treated W lowers to 200° C.

In the embodiment shown in the figure, the hot plate 1 is positioned in the upside, while the cool plate 2 is positioned in the downside. However, they may be positioned oppositely.

As is fully explained above, according to the present invention, a raw material of a low dielectric constant is applied onto a surface of the plate-like material to be treated such as a semiconductor wafer or a glass substrate, and at the time of baking this to form a coating film, the oxygen concentration in the atmosphere is reduced to be less than or equal to 1% under the condition that the surface temperature of the plate-like material to be treated is higher than or equal to 200° C. As a result, it is possible to prevent the Si—$CH_3$ bonding and/or the Si—H bonding from breaking and forming Si—OH, thereby a coating film of a low dielectric constant can be obtained.

What is claimed is:

1. A method for forming a coating film, comprising the steps of:
    applying a raw material of a low dielectric constant onto a surface of a plate-like material to be treated;
    reducing oxygen concentration in the atmosphere surrounding the plate-like material to be less than or equal to 1% before a surface temperature of said plate-like material to be treated rises to 200° C.;
    cooling the plate-like material, wherein said cooling step is performed at the time of reducing the oxygen concentration in the atmosphere; thereafter
    heating said plate-like material to be treated to a temperature greater than or equal to 400° C.; and then
    maintaining the oxygen content in the atmosphere to be less than or equal to 1% until the surface temperature of said plate-like material to be treated lowers to 200° C.;
    said raw material is an organic SOG obtained by hydrolyzing and condensing at least one alkoxysilane compound expressed by the following equation (I) into an organic solvent under an acid catalyst, $$RnSi(OR^1)_{4-n} \qquad (I)$$

where R is an alkyl group or an aryl group having a carbon number of 1-4, $R^1$ is an alkyl group having a carbon number of 1-4, and n is an integer of 0-2.

2. A method for forming a coating film as defined in claim 1, wherein said organic SOG is obtained by hydrolyzing and condensing at least one alkoxysilane compound expressed by the equation (I) in which n=1 or n=2 into an organic solvent under an acid catalyst.

3. A method for forming a coating film as defined in claim 1, wherein said organic SOG is obtained by hydrolyzing and condensing an alkoxysilane compound expressed by the equation (I) in which n=1 and an alkoxysilane compound expressed by the equation (I) in which n=0 into an organic solvent under an acid catalyst.

4. A method for forming a coating film as defined in claim 1, wherein said organic SOG is obtained by hydrolyzing and condensing an alkoxysilane compound expressed by the equation (I) in which n=0 and an alkoxysilane compound expressed by the equation (I) in which n=1 and an alkoxysilane compound expressed by the equation (I) in which n=0 into an organic solvent under an acid catalyst.

5. A method for forming a coating film, comprising the steps of:
    applying a raw material of a low dielectric constant onto a surface of a plate-like material to be treated;
    reducing oxygen concentration in the atmosphere surrounding the plate-like material to be less than or equal to 1% before a surface temperature of said plate-like material to be treated rises to 200° C.;
    cooling the plate-like material, wherein said cooling step is performed at the time of reducing the oxygen concentration in the atmosphere; thereafter
    heating said plate-like material to be treated to a temperature greater than or equal to 400° C.; and then
    maintaining the oxygen content in the atmosphere to be less than or equal to 1% until the surface temperature of said plate-like material to be treated lowers to 200° C.;
    said raw material is an organic SOG obtained by hydrolyzing and condensing at least one alkoxysilane compound expressed by the following equation (II) into an organic solvent under an acid catalyst, $$RnSi(OR^1)_3 \qquad (II)$$

where R is an alkyl group or an aryl group having a carbon number of 1-4, and $R^1$ is an alkyl group having a carbon number of 1-4.

6. A method for forming a coating film as defined in claim 5, wherein said organic SOG comprises a ladder type condensation product.

7. A method for forming a coating film as defined in claim 1, wherein said raw material is an organic SOG obtained by hydrolyzing and condensing into an organic solvent under an acid catalyst selected from the group comprising:
    one alkoxysilane compound expressed by the equation (I) where n=1;
    one alkoxysilane compound expressed by the equation (I) where n=1 and one alkoxysilane compound expressed by the equation (I) where n=0; and
    one alkoxysilane compound expressed by the equation (I) where n=1, one alkoxysilane compound expressed by the equation (I) where n=2, and one alkoxysilane compound expressed by the equation (I) where n=0.

8. A method for forming a coating film as defined in claim 1, wherein said raw material is an organic SOG obtained by hydrolyzing and condensing into an organic solvent under an acid catalyst a monoalkyl trialkoxysilane compound expressed by the equation (I) where n=1 and a tetraalkoxysilane compound expressed by the equation (I) where n=0; and relative proportions of said compounds are 2.0-6.0 mols of said monoalkyl trialkoxysilane compound with respect to 1 mol tetraalkoxysilane compound.

9. A method for forming a coating film as defined in claim 1, wherein said raw material is an organic SOG obtained by hydrolyzing and condensing into an organic solvent under an acid catalyst a monoalkyl trialkoxysilane compound expressed by the equation (I) where n=1, a dialkyl dialkoxysilane compound expressed by the equation (I) where n=2, and a tetraalkoxysilane compound expressed by the equation (I) where n=0; and relative proportions of said compounds are 0.5-4.0 mols of said tetraalkoxysilane compound and 0.5-4.0 mols of said monoalkyl trialkoxysilane compound with respect to 1 mol of said dialkyl dialkoxysilane compound.

* * * * *

UNITED STATES PATENT AND TRADEMARK OFFICE
CERTIFICATE OF CORRECTION

PATENT NO. : 7,300,889 B2
APPLICATION NO. : 10/914523
DATED : November 27, 2007
INVENTOR(S) : Endo et al.

It is certified that error appears in the above-identified patent and that said Letters Patent is hereby corrected as shown below:

Title page 1:
    Under item "(56) References Cited", further under "OTHER PUBLICATIONS", change "Handbook of IOW aand High Dielectric COnstant Materials and Thier Applications" to --Handbook of IOW and High Dielectric Constant Materials and Their Applications--.
    In the "(57) ABSTRACT", 1st line, after "a coating film" delete the comma;
        6th line, delete "to be treated";
        11th line, delete "to be treated".
Title page 2:
    Under item (56) "OTHER PUBLICATIONS", change "LAttice Press: SUnset Beach" to --Lattice Press: Sunset Beach--.
Column 1:
    Line 18, change "enables to reduce a" to --enables reduction of a--.
    Line 30, change "isolation film" to --insulation film--.
Column 2:
    Line 12, change "causes a increase" to --causes an increase--.
    Line 38, change "by means of an elevator means." to --by means of an elevator.--.
Column 4:
    Line 18, change "With regards to" to --With regard to--.
Column 6:
    Line 32, change "alcohol react each other" to --alcohol react with each other--.
    Line 51, change "With regards to the" to --With regard to the--.

Signed and Sealed this

Twentieth Day of May, 2008

JON W. DUDAS
*Director of the United States Patent and Trademark Office*